United States Patent [19]
Sikkink et al.

[11] Patent Number: 5,418,481
[45] Date of Patent: May 23, 1995

[54] REPETITIVE SIGNAL DETECTOR FOR PREVENTING THERMAL RUNAWAY

[75] Inventors: Mark R. Sikkink, Chippewa Falls; Mario J. Rizzo, Eau Claire, both of Wis.

[73] Assignee: Cray Research, Inc., Eagan, Minn.

[21] Appl. No.: 165,747

[22] Filed: Dec. 10, 1993

[51] Int. Cl.$^6$ .......... H03K 5/19; G01R 23/15
[52] U.S. Cl. .......... 327/20; 327/144; 327/292
[58] Field of Search .......... 328/120; 307/518; 377/28, 30; 327/18, 20, 37, 38, 378, 144, 292, 526; 364/486

[56] References Cited

U.S. PATENT DOCUMENTS

| | | | |
|---|---|---|---|
| 3,725,593 | 4/1973 | Palombari | 327/292 |
| 4,019,143 | 4/1977 | Fallon et al. | 327/144 |
| 4,156,200 | 5/1979 | Gomez | 327/292 |
| 4,277,693 | 7/1981 | Hoekman | 327/526 |
| 4,374,361 | 2/1983 | Holden | 307/518 |
| 4,446,437 | 5/1984 | Rinaldi | 328/120 |
| 5,138,636 | 8/1992 | Bardin | 328/120 |

*Primary Examiner*—Timothy P. Callahan
*Assistant Examiner*—Terry L. Englund
*Attorney, Agent, or Firm*—Schwegman, Lundberg & Woessner

[57] ABSTRACT

A circuit monitors electronic devices which require continuous clocking for non-destructive operation. The circuit samples a repetitive signal, such as a clock, from a device of interest (DOI). If, for whatever reason, the clock signal becomes absent, the circuit responds by deactivating the DOI. If the clock revives or becomes intermittent the circuit will not reactivate the DOI. The circuit will reactivate the DOI only upon application of an explicit reset signal. The circuit is all digital and therefore technology independent, and provides for precise control of the deactivation response time.

2 Claims, 4 Drawing Sheets

REPETITIVE SIGNAL DETECTOR FOR PREVENTING THERMAL RUNAWAY

FIELD OF THE INVENTION

The present invention relates generally to the field of electronic circuit components, and more specifically to a repetitive signal detection circuit for use with electronic components which require a repetitive signal for non-destructive operation.

BACKGROUND

Certain technologies used today in the manufacture of electronic components require that a repetitive signal, such as a clock, be continuously applied to the component for non-destructive operation. Without such a repetitive signal, the components may enter a destructive high current (thermal runaway) state. This problem is particularly encountered with CMOS electronic components. Thus there is a need in the art for a circuit which monitors a repetitive signal applied to an electronic component, and which deactivates that component in the event that the repetitive signal becomes absent. The circuit further should enable a switch to a secondary repetitive signal such that a repetitive signal is continuously applied to the component to avoid destruction of the part. There is also a need for such a circuit which will not prematurely deactivate the component in the event of short term error bursts in the repetitive signal. Further, it is desirable for such a circuit to be compatible with the wide variety of technologies used in the manufacture of electronic components.

SUMMARY

To overcome limitations in the art described above and to overcome other limitations that will become apparent upon reading and understanding the present specification, the present repetitive signal detection circuit provides a way of monitoring electronic components which require continuous clocking for non-destructive operation. The circuit samples a repetitive signal, such as a clock, from a device of interest (DOI). If, for whatever reason, the clock signal becomes absent, the present circuit responds by deactivating the DOI. The circuit also enables a switch over to a secondary clock which is then applied to avoid destruction of the DOI. If the clock revives or becomes intermittent the present circuit will not reactivate the DOI. The circuit will reactivate the DOI only upon application of an explicit reset signal. The circuit is implemented using only digital components, is therefore technology independent and easily mapped to any logic family. The digital implementation also provides for more precise control of the deactivation response time.

BRIEF DESCRIPTION OF THE DRAWINGS

The various objects, features and advantages of the present invention will be more readily apparent upon reading and understanding the present specification and accompanying drawings in which.

DETAILED DESCRIPTION OF THE PREFERRED EMBODIMENT

In the following detailed description of the preferred embodiment, reference is made to the accompanying drawings which form a part hereof, and in which is shown by way of illustration a specific embodiment in which the invention may be practiced. It shall be understood that other embodiments may be utilized and structural changes made without departing from the scope of the present invention.

Figure 1:
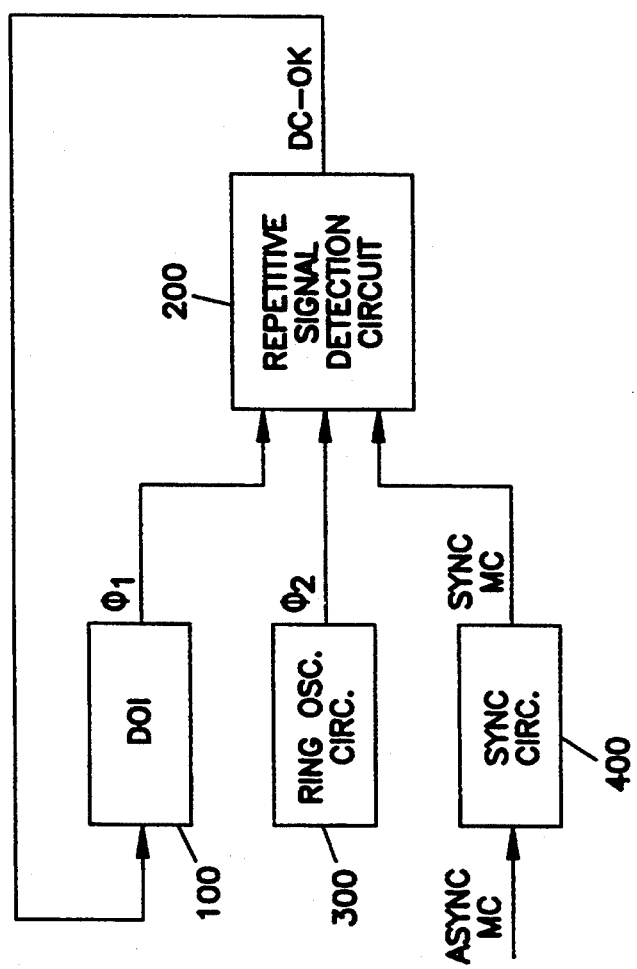
FIG. 1 shows the environment in which the present repetitive signal detection circuit is used.

FIG. 1 shows the present repetitive signal detection circuit 200 attached to a device of interest (DOI) a ring oscillator circuit 300 and a master clear synchronization circuit 400. The circuit 200 monitors a repetitive signal, such as a clock, $\phi_1$, of the DOI and asserts a signal, DC-OK, to enable a switch to a secondary clock (not shown) in the event that $\phi_1$ fails or disappears in order to prevent destruction of the DOI. The secondary clock may be provided internally on the DOI, and is switched on in response to the DC-OK signal provided by this invention. The signals $\phi 2$ and SYNC MC generated by ring oscillator circuit 300 and master clear synchronization circuit 400, respectively are used by the present circuit 200 as described below.

Figure 2:
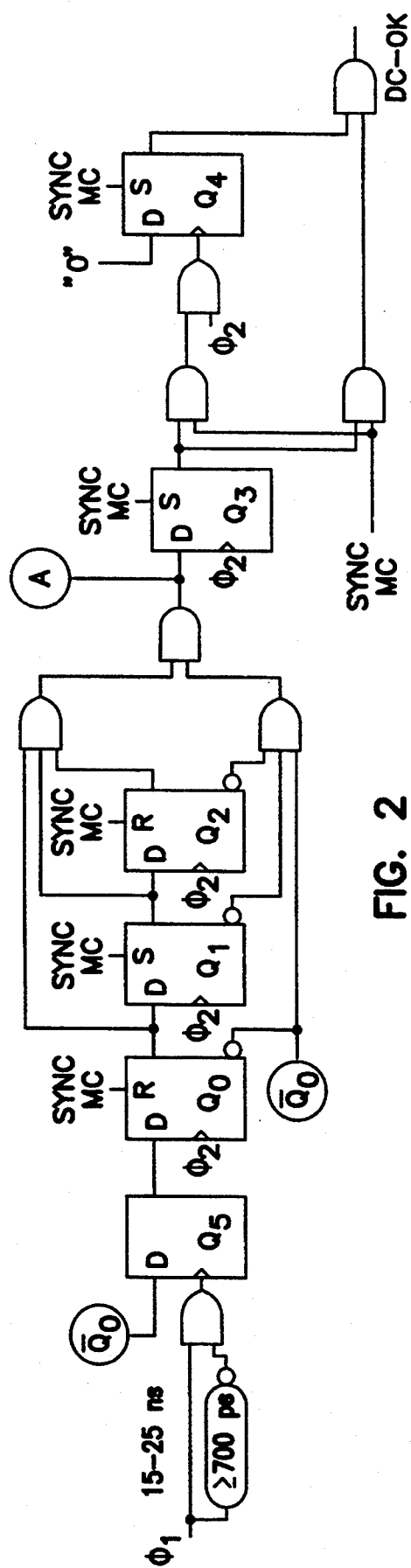
FIG. 2 shows the present repetitive signal detection circuit.

FIG. 2 shows the preferred implementation of the present repetitive signal detection circuit. The circuit is comprised of input flip-flop Q5, a chain of flip-flops Q0-Q2, and output flip-flops Q3 and Q4. The input to the circuit is $\phi 1$, the repetitive signal being sampled by the circuit from the device of interest (DOI). The $\phi 1$ signal is in the preferred embodiment a system clock with a frequency on the order of 15-25 nanoseconds. However, it shall be understood that the present circuit can be used to monitor a repetitive signal of any frequency without departing from the scope of the present invention. Flip-flops Q0-Q4 are clocked with the signal $\phi 2$. $\phi 2$ is a free running clock which is independent of system clock $\phi 1$ but which has a frequency that has a certain guaranteed relationship to $\phi 1$ as described below. The $\phi 2$ signal is generated by the ring oscillator circuit shown as described below with respect to FIG. 4.

The number of latches in the chain Q0-Q2 can be varied for fine adjustment of the deactivation response time. For example, if greater error is permitted in the system clock signal $\phi 1$, more latches could be added to the chain to increase the deactivation response time. However, it is important that the deactivation response time not be longer than the thermal time constant of the technology used for the DOI. This is necessary to avoid possible destruction of the part which could occur if a secondary clock is not applied within that period of time.

Figure 3:
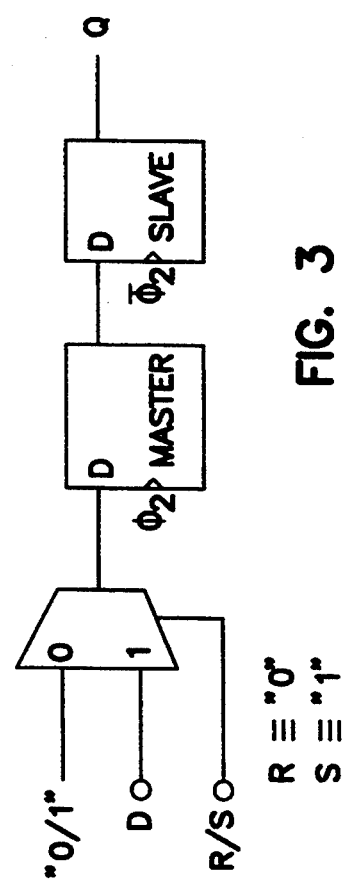
FIG. 3 shows one implementation of flip-flops Q0-Q4 of FIG. 2.

Memory element Q5 is configured as a toggle flip-flop. Q0-Q4 are configured as D flip-flops with synchronous set/reset. FIG. 3 shows the detailed implementation of a D flip-flop with synchronous set/reset that is used for Q0-Q4. In FIG. 3, a master-slave flip-flop pair is connected to an input multiplexer. The "1" input to multiplexer is used as the "D" flip-flop input. The select input to the multiplexer is a synchronized version of a master clear signal, and is either a set ("1") or a reset ("0"). The multiplexer output is input to the master flip-flop which is clocked with the $\phi2$ signal. The slave follows the output of the master but is clocked on the complemented $\phi2$ signal.

Referring again to FIG. 2, in the case that a failure is detected with the $\phi1$ signal, the present circuit enables a switch over to a secondary clock to ensure continuous application of a clock signal to the DOI. The present signal detection circuit accomplishes this by causing a transition in the DC-OK signal. A transition in the DC-OK signal from "1" to "0" enables a switch from system clock $\phi1$ to a secondary clock (not shown typically provided on the DOI), which is then applied to the DOI. The DC-OK signal also deactivates the DOI in the sense that the part is no longer generating valid data. Thus, the purpose of the present repetitive signal detection circuit is simply to maintain a clock signal to the DOI to prevent destruction of the DOI. Upon recovery of the system clock, explicit assertion of the synchronous master clear signal causes the DC-OK signal to return to "1", thus reactivating the DOI.

Figure 4:
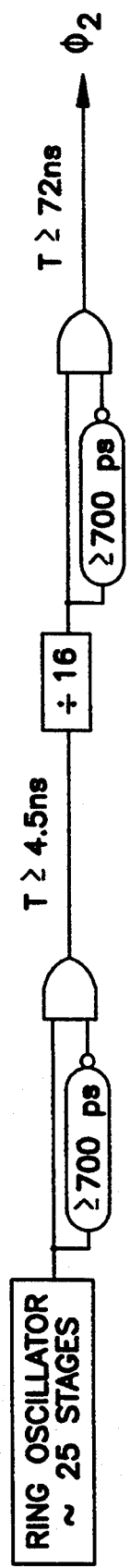
FIG. 4 shows a ring oscillator circuit which generates the $\phi 2$ signal.

FIG. 4 shows the ring oscillator circuit which generates the free-running $\phi2$ sampling signal. An important advantage to the present repetitive signal detection circuit is that the sampling clock, $\phi2$, is not required to fall within a min/max frequency window. The design of the present circuit requires only that the period of $\phi2$ be above some defined minimum. In the preferred embodiment, this minimum period is defined to be at least twice the period of system clock $\phi1$, the Nyquist sampling criteria.

The circuit of FIG. 4 includes a ring oscillator comprised of approximately 25 stages to guarantee a minimum period of 4.5 nanoseconds to satisfy the required relationship with $\phi1$. Dividing the frequency of the 4.5 ns signal by sixteen eliminates the need for more stages in the ring oscillator, and results in a $\phi2$ signal having a period greater than or equal to 72 ns. The $\phi2$ signal may be fanned out as needed to supply a sampling clock to multiple repetitive signal detection circuits as desired in a system.

Figure 5:
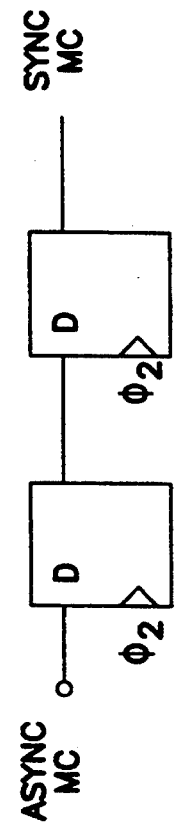
FIG. 5 shows circuitry for synchronization of an asynchronous master clear signal to the $\phi 2$ signal.

An asynchronous master clear signal generally present in the environment of the DOI is used to initialize the present circuit. Preferably, the master clear signal can be globally or selectively applied to the components in the system. The ability to apply the master clear signal to selected components avoids the need to restart the entire system whenever one component goes bad, and allows the bad component to be repaired or replaced and brought back up without disturbing the other system components. The master clear signal must be synchronized to the $\phi2$ signal for proper resetting of the present circuit when the system clock returns. FIG. 5 shows the circuitry for synchronizing the master clear signal to $\phi2$.

Figure 6:
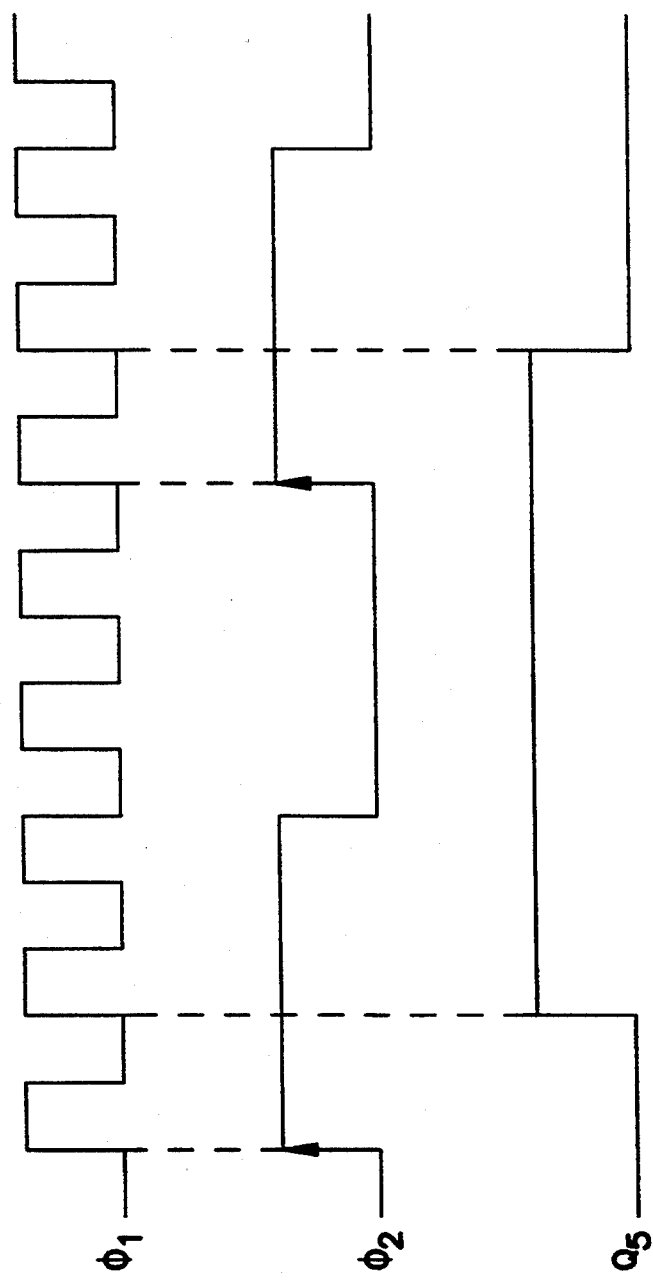
FIG. 6 shows a timing diagram for the present repetitive signal detection circuit.

Referring again to FIG. 2, the operation of the present repetitive signal detection circuit will be explained. At initial reset via the synchronous master clear signal, flip-flops Q0 and Q2 are "reset", and flip-flop Q1 is "set" such that the initial state of Q0, Q1, Q2=0, 1, 0. The input to toggle flip-flop Q5 is connected to the complemented output of flip-flop Q0. This essentially turns the Q5 and Q0 flip-flops into a divider. Because of the toggle action of Q5, the Q5 output toggles at every active $\phi2$ edge (see FIG. 6). Since the frequency of $\phi1$ is at least twice the frequency of $\phi2$, the new state of Q5 is ensured to be reliably captured before the next active $\phi2$ edge. Subsequent states of flip-flops Q0–Q2 are a string of alternating 1's and 0's because of the toggle action of Q5. The outputs of Q0–Q2 are OR'ed as are the complement outputs of Q0–Q2. The result of the OR's are then ANDed together. Under normal operating conditions, then, the result of node A is a "1" because the string of alternating 1's and 0's in flip-flops Q0–Q2 means that both OR's will always output a "1".

If, however, $\phi1$ were to fail or disappear then Q5 is not clocked and its output will remain constant instead of toggling. Thus, the state of Q0, Q1, Q2 will become 1, 1, 1 or 0,0,0. If Q0–2 are all 1's or all 0's then node A, which is normally a "1", will become a "0". On the next active edge of $\phi2$ this "0" at node A will advance through Q3, forcing its output to "0" and causing the DC-OK signal to transition from "1" to "0" (the DC-OK signal is normally a "1" due to normal "1" output at Q4 and normal "1" output of Q3 and SYNCMC). This transition in the DC-OK signal deactivates the DOI and enables a switch to a secondary clock.

Also at this stage, $\phi2$ is enabled at the clock input of flip-flop Q4. On the next active edge of $\phi2$, memory element Q4 stores a "0" on its output, causing the DC-OK signal to remain at "0" until an explicit synchronous master clear signal is applied. The deactivation is permanent. Once the Q4 output goes to 0, the DOI cannot be reactivated (i.e., Q4 output set to "1") unless an explicit synchronous master clear is used to "set" Q4. In this way, Q4 holds the deactivation so that spurious edges on $\phi1$ do not cause the DOI to be erroneously reactivated. Thus, if $\phi1$ were to revive or become intermittent and thus cause the output of Q3 to return to "1", the DOI will not be erroneously reactivated due to the "0" output of Q4, thus holding DC-OK at "0" until the explicit reset is applied.

The DC-OK signal enables a switch over to a secondary clock, which is then applied to the DOI, ensuring continuous clocking to avoid destruction of the DOI. The one-shot behavior of the present circuit also ensures that the secondary clock is not mistaken for the system clock. If the circuit were not a one-shot circuit, the secondary clock would be seen at $\phi1$ and thus could result in the DOI being reactivated erroneously.

The present repetitive signal detection circuit thus includes several advantageous features. The circuit provides for deactivation of the DOI and enables a switch to a secondary clock, ensuring continuous application of a clock signal to prevent destruction of the DOI. The circuit is implemented using only digital components, thus permitting easy mapping of the design to any logic family such as ECL, CMOS, TTL, etc. The digital implementation also provides for more precise control of the deactivation response time simply by adding more flip-flops to the chain. The design also saves valuable printed circuit board space over conventional analog techniques.

Although a specific embodiment has been illustrated and described herein, it will be appreciated by those skilled in the art that any arrangement which is calculated to achieve the same purpose may be substituted for the specific embodiment shown. For example, the present repetitive signal detection circuit may be used to monitor any repetitive signal frequency. In addition, those skilled in the art will recognize that, the present invention is not dependent upon the specific type of flip-flops or other memory elements used, or the specific logic designs or logic families disclosed in the detailed description. This application is intended to cover any adaptations or variations of the present invention. Therefore, it is manifestly intended that this invention be limited only by the claims and the equivalents thereof.

We claim:

1. A repetitive signal detection circuit for monitoring the continued presence of a repetitive signal, such as a clock, applied to a device of interest (DOI), comprising:
   signal comparison means;
   means for applying the repetitive signal to said signal comparison means;
   means for applying reference clock signals to said signal comparison means;
   said signal comparison means including a timing chain of flip flops responsive to said repetitive signal and said reference clock signals and operative in response to a discontinuation of the repetitive signal for a predetermined number of cycles to switch state of an output signal, thereby enabling a switch over to a secondary clock; and
   said reference clock signal having a period at least twice the period of the repetitive signal, and said timing chain including a number of flip flops, including a plurality of timing flip flops and an input flip flop connected to one of the plurality of timing flip flops, wherein the input flip flop latches the state of one of the timing flip flops during a transition of the repetitive signal and wherein the number of timing flip flops is chosen to select a deactivation time less than a thermal runaway constant of the DOI.

2. A repetitive signal detector according to claim 1, wherein said output of said signal comparison means is latched and remains switched even upon the recurrence of the repetitive signal being monitored, until reset by a master reset.

* * * * *

UNITED STATES PATENT AND TRADEMARK OFFICE
CERTIFICATE OF CORRECTION

PATENT NO. : 5,418,481

DATED : May 23, 1995

INVENTOR(S) : Mark R. Sikkink and Mario J. Rizzo

It is certified that error appears in the above-indentified patent and that said Letters Patent is hereby corrected as shown below:

Column 2, line 19, please delete "of interest (DOI) a ring" and insert --of interest (DOI), a ring-- therefore.

Column 2, line 30, please delete "400, respectively are used" and insert --400, respectively, are used-- therefore.

Signed and Sealed this

Thirty-first Day of October 1995

BRUCE LEHMAN

Attest:

Attesting Officer

Commissioner of Patents and Trademarks